United States Patent
Zhou

(10) Patent No.: US 9,773,778 B2
(45) Date of Patent: Sep. 26, 2017

(54) SEMICONDUCTOR DEVICE, RELATED MANUFACTURING METHOD, AND RELATED ELECTRONIC DEVICE

(71) Applicant: Semiconductor Manufacturing International (Shanghai) Corporation, Shanghai (CN)

(72) Inventor: Fei Zhou, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 15/040,573

(22) Filed: Feb. 10, 2016

(65) Prior Publication Data
US 2016/0284684 A1    Sep. 29, 2016

(30) Foreign Application Priority Data
Mar. 24, 2015 (CN) .......................... 2015 1 0131193

(51) Int. Cl.
| H01L 21/00 | (2006.01) |
| H01L 27/02 | (2006.01) |
| H01L 27/06 | (2006.01) |

(52) U.S. Cl.
CPC ...... *H01L 27/0255* (2013.01); *H01L 27/0629* (2013.01)

(58) Field of Classification Search
CPC .................. H01L 27/0255; H01L 27/0629
See application file for complete search history.

(56) References Cited

U.S. PATENT DOCUMENTS

| 6,974,983 B1 * | 12/2005 | Hill ................ H01L 21/845 257/292 |
| 7,388,259 B2 * | 6/2008 | Doris ................ H01L 21/84 257/347 |
| 8,497,177 B1 * | 7/2013 | Chang ............ H01L 29/66795 438/283 |

* cited by examiner

*Primary Examiner* — Richard Booth
(74) *Attorney, Agent, or Firm* — Innovation Counsel LLP

(57) ABSTRACT

A semiconductor device may include a first doped region, a second doped region, two fin members, and an isolation member. The first doped region may have a first dopant type. The second doped region may have a second dopant type and may be positioned between two portions of the first doped region. The two fin members may overlap at least one of the first doped region and the second doped region. The isolation member may be formed of a dielectric material and may be positioned between the two fin members. The second doped region may be positioned between the isolation member and the first doped region.

11 Claims, 5 Drawing Sheets

SEMICONDUCTOR DEVICE, RELATED MANUFACTURING METHOD, AND RELATED ELECTRONIC DEVICE

CROSS-REFERENCE TO RELATED APPLICATION

This application claims priority to and benefit of Chinese Patent Application No. 201510131193.9, filed on 24 Mar. 2015; the Chinese Patent Application is incorporated herein by reference in its entirety.

BACKGROUND

The technical field is related to a semiconductor device, a method for manufacturing the semiconductor device, and an electronic device that includes the semiconductor device.

In semiconductor devices, such as field-effect transistors, short-channel effects may negatively affect performance of the semiconductor devices. Semiconductor devices with fin structures may mitigate short-channel effects. Nevertheless, semiconductor devices with fin structure may be substantially susceptible to device failures caused by electrostatic discharge (ESD) events.

SUMMARY

An embodiment may be related to a semiconductor device. The semiconductor device may include a first doped region, a second doped region, two fin members, and an isolation member. The first doped region may have a first dopant type. The second doped region may have a second dopant type and may be positioned between two portions of the first doped region. The two fin members may overlap at least one of the first doped region and the second doped region. The isolation member may be formed of a dielectric material and may be positioned between the two fin members. The second doped region may be positioned between the isolation member and the first doped region.

The first dopant type may be p-type if the second dopant type is n-type. The first dopant type may be n-type if the second dopant type is p-type.

A carrier concentration of the second doped region may be higher than a carrier concentration of the first doped region. The two fin members may have the second dopant type. The carrier concentration of the second doped region may be higher than a carrier concentration of the two fin members.

At least two opposite sides of the second doped region may directly contact the first doped region. At least three sides of the second doped region may directly contact the first doped region. A side of second doped region may directly contact the isolation member and may be parallel to a bottom side of the semiconductor device.

The second doped region may overlap both the two fin members. The second doped region may directly contact both the two fin members. The isolation member may directly contact both the fin members.

An embodiment may be related to a method for manufacturing a semiconductor device. The method may include the following steps: providing a first doped region, which has a first dopant type; providing a second doped region, which has a second dopant type and may be positioned between two portions of the first doped region; providing two fin members, which overlap at least one of the first doped region and the second doped region; and providing an isolation member, which may be formed of a dielectric material and may be positioned between the two fin members, wherein a top side of the isolation member may be higher than bottom sides of the two fin members and may be lower than top sides of the two fin members.

The first dopant type may be p-type if the second dopant type is n-type. The first dopant type may be n-type if the second dopant type is p-type.

A carrier concentration of the second doped region may be higher than a carrier concentration of the first doped region and may be higher than a carrier concentration of the two fin members.

At least two opposite sides of the second doped region may directly contact the first doped region. At least three sides of the second doped region may directly contact the first doped region.

The second doped region may be positioned between the isolation member and the first doped region. The second doped region overlaps both the two fin members. The second doped region may directly contact both the two fin members. The isolation member may directly contact both the fin members.

An embodiment may be related to a semiconductor device. The semiconductor device may include a first doped region, a second doped region, two fin members, and an isolation member. The first doped region may have a first dopant type. The second doped region may have a second dopant type and may be positioned between two portions of the first doped region. The two fin members may overlap at least one of the first doped region and the second doped region. The isolation member may be formed of a dielectric material, may be positioned between the two fin members, and may directly contact both the two fin members.

An embodiment may be related to an electronic device. The electronic device may include an electronic component and a semiconductor device that is electrically connected to the electronic component. The semiconductor device may have one of more of the above-mentioned features.

According to embodiments, a semiconductor device with one or more fin structures may have a p-n junction diode that has a sufficiently large area. The diode may enable effective (and robust) protection of the semiconductor device against potential electrostatic discharge (ESD) events. Advantageously, satisfactory performance and/or reliability of the semiconductor device (and an associated electronic device) may be attained.

The above summary is related to some of many embodiments disclosed herein and is not intended to limit the scope of embodiments.

DETAILED DESCRIPTION

Figure 1:
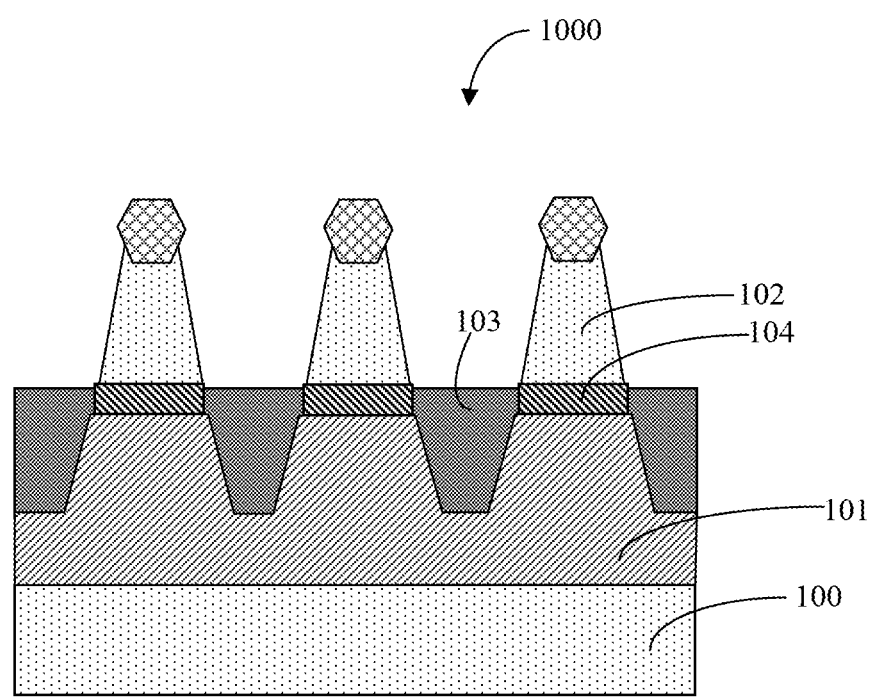
FIG. 1 shows a schematic diagram (e.g., a schematic cross-sectional view) that illustrates elements and/or structures in a semiconductor device in accordance with one or more embodiments.

Example embodiments are described with reference to the accompanying drawings. As those skilled in the art would realize, the described embodiments may be modified in various different ways, all without departing from the spirit or scope. Embodiments may be practiced without some or all of these specific details. Well known process steps and/or structures may not have been described in detail in order to not unnecessarily obscure described embodiments.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting possible embodiments. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements should not be limited by these terms. These terms may be used to distinguish one element from another element. Thus, a first element discussed below may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may be provided between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the embodiments. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive". The term "electrically connected" may mean "electrically connected without any intervening transistors".

The term "conductor" may mean "electrically conductive member". The term "insulator" may mean "electrically insulating member". The term "dielectric" may mean "dielectric member". The term "interconnect" may mean "interconnecting member". The term "provide" may mean "provide and/or form". The term "form" may mean "provide and/or form".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, embodiments may also cover apparatuses for practicing embodiments. Such apparatus may include circuits, dedicated and/or programmable, to carry out operations pertaining to embodiments. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments.

FIG. 1 shows a schematic diagram (e.g., a schematic cross-sectional view) that illustrates elements and/or structures in a semiconductor device 1000 in accordance with one or more embodiments. The semiconductor device 1000 may include a semiconductor substrate portion 100, a p-well 101 that overlaps the semiconductor substrate portion 100, n+ doped members 104 (or highly doped n-type members 104) that contact the p-well 101, fin members 102 that are positioned on the n+ doped members 104, and isolation members 103 that are positioned between the n+ doped members 104. The n+ doped members 104 may form diodes with the p-well 101. The diodes may protect the semiconductor device 1000 against potential electrostatic discharge (ESD) events.

Figure 2:
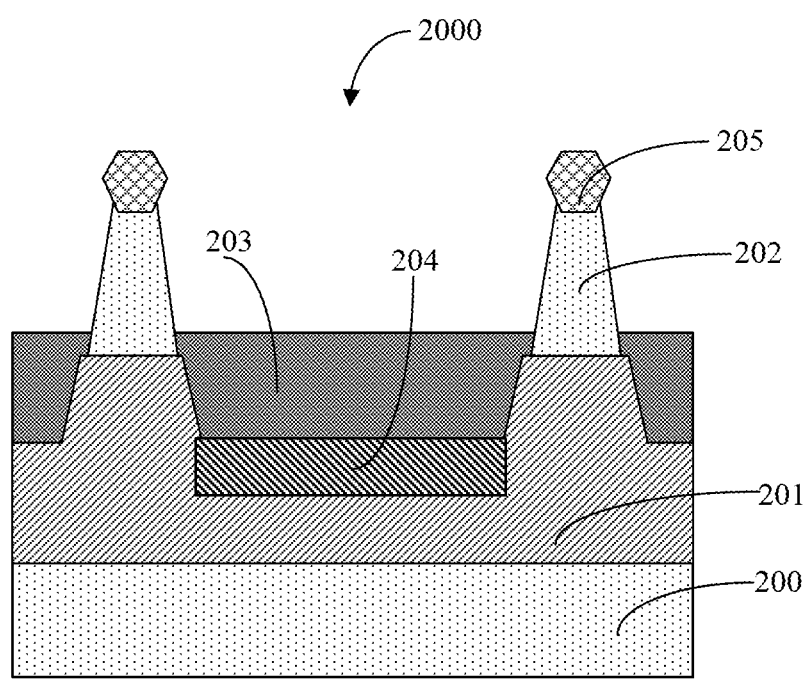
FIG. 2 shows a schematic diagram (e.g., a schematic cross-sectional view) that illustrates elements and/or structures in a semiconductor device in accordance with one or more embodiments.

FIG. 2 shows a schematic diagram (e.g., a schematic cross-sectional view) that illustrates elements and/or structures in a semiconductor device 2000 in accordance with one or more embodiments. The semiconductor device 2000 may include substrate portion 200, a doped region 201, a doped region 204, two fin members 202, an isolation member 204, and two doped portions 205.

The substrate portion 200 may be formed of or include a semiconductor material. The substrate portion 200 may be or include at least one of a monocrystalline silicon substrate portion, a polycrystalline silicon substrate portion, a silicon-on-insulator (SOI) substrate portion, a stacked silicon-on-insulator (SSOI) substrate portion, a stacked silicon-germanium-on-insulator (S-SiGeOI) substrate portion, a silicon-germanium-on-insulator (SiGeOI) substrate portion, and a germanium-on-insulator (GeOI) substrate portion.

The doped region 201 be a well structure and may be positioned on/in the substrate portion 200. The doped region 201 may have a first dopant type. In an embodiment, the substrate portion 200 may be or include a doped substrate portion and may have the first dopant type.

The doped region 204 may have a second dopant type. The second dopant type may be different from and/or opposite to the first dopant type. The first dopant type may be p-type if the second dopant type is n-type. The first dopant type may be n-type if the second dopant type is p-type. The doped region 204 may be a highly doped region (or heavily doped region). A carrier concentration of the doped region 204 may be higher than a carrier concentration of the doped region 201. The doped region 204 may be positioned between two portions of the doped region 201. The doped region 204 may be positioned inside the doped region 201 and/or may be surrounded by the doped region 201. Two opposite sides of the doped region 204 may directly contact the two portions of the doped region 201. At least three sides of the doped region 204 may directly contact the doped region 201. The doped region 201 and the doped region 202 may form a p-n junction diode that has a sufficiently large area. The diode may enable effective (and robust) protection of the semiconductor device 2000 against potential electrostatic discharge (ESD) events. Advantageously, satisfactory performance and/or reliability of the semiconductor device 2000 (and an associated electronic device) may be attained.

The two fin members 202 may overlap at least one of the doped region 201 and the doped region 204. The two fin members 202 may directly contact the doped region 201 and may be isolated from the doped region 204. A material of the two fin members 202 may be identical to or analogous to a material of the substrate portion 200; nevertheless, the dopant type of the two fin members 202 may be different from and/or opposite to the dopant type of the substrate portion 200. The two fin members 202 may have the second dopant type. The carrier concentration of the doped region 204 may be higher than a carrier concentration of each of the two fin members 202. The two fin members may function as channels in the semiconductor device 2000.

The isolation member 204 may be formed of a dielectric material, such silicon oxide and/or silicon oxynitride. The isolation member 204 may be positioned between the two fin members 202, may directly contact both the two fin members 202, and may isolate the two fin members 202 from each other. A top side of the isolation member may be higher than bottom sides of the two fin members 202 and may be lower than top sides of the two fin members 202. The doped region 204 may be positioned between the isolation member 204 and the doped region 201. A side of doped region 204 may directly contact the isolation member 204 and may be parallel to a bottom side of the semiconductor device 2000 (and parallel to a top side of the isolation member 204).

The two doped portions 205 may respectively positioned on the two fin members 202. A doped portion 205 may be a silicon-germanium (SiGe) member and may function as a source terminal or a drain terminal of a p-channel unit of the semiconductor device 2000. A doped portion 205 may be a silicon carbide (SiC) member and may function as a source terminal or a drain terminal of an n-channel unit of the semiconductor device 2000.

FIG. 3, FIG. 4, FIG. 5, FIG. 6, FIG. 7, FIG. 8, and FIG. 9 show schematic diagrams (e.g., schematic cross-sectional views) that illustrate elements and/or structures formed in a method for manufacturing the semiconductor device 3000 in accordance with one or more embodiments.

Figure 3:
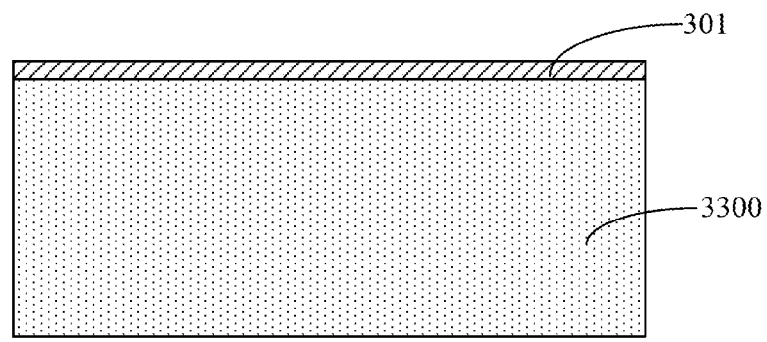
FIG. 3, FIG. 4, FIG. 5, FIG. 6, FIG. 7, FIG. 8, and FIG. 9 show schematic diagrams (e.g., schematic cross-sectional views) that illustrate elements and/or structures formed in a method for manufacturing a semiconductor device in accordance with one or more embodiments.

Referring to FIG. 3, the method may include preparing a substrate material member 3300. The material member 3300 may be or include at least one of a monocrystalline silicon substrate material member, a polycrystalline silicon substrate material member, a silicon-on-insulator (SOI) substrate material member, a stacked silicon-on-insulator (SSOI) substrate material member, a stacked silicon-germanium-on-insulator (S-SiGeOI) substrate material member, a silicon-germanium-on-insulator (SiGeOI) substrate material member, and a germanium-on-insulator (GeOI) substrate material member. In an embodiment, the substrate material member 3300 may be or include a doped substrate material member and may have a first dopant type.

The method may include providing a pad layer 301 on the substrate material member 3300. The pad layer 301 may be or include at least one of a silicon oxide (SiO) layer and a silicon nitride (SiN) layer. The pad layer 301 may be formed through at least one of a chemical vapor deposition process, a physical vapor deposition process, etc. A thickness of the pad layer 301 may be in a range of 200 angstroms to 1000 angstroms. The pad layer 301 may effectively protect material of the substrate material member 3300 in a subsequent ion implantation process.

Figure 4:
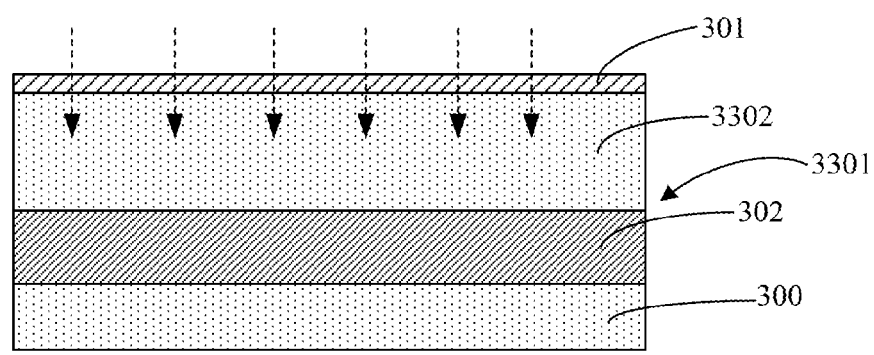

Referring to FIG. 3 and FIG. 4, the method may include performing an ion implantation process on the substrate material member 3300 through the pad layer 301 to form a doped substrate material member 3301. The doped substrate material member 3301 may include a substrate portion 300, a doped region 302 positioned on/in the substrate portion 300, and a substrate material portion 3302 positioned between the doped region 302 and the pad layer 301.

The doped region 302 may be predetermined to have the first dopant type. First-type dopant elements may be used in the ion implantation process. In an embodiment, the first dopant type may be p-type, and boron (B) ions may be implanted into the substrate material member 3300 in the ion implantation process. In an embodiment, the first dopant type may be n-type, and arsenic (As) ions may be implanted into the substrate material member 3300 in the ion implantation process.

The method may include controlling an ion implantation depth of the ion implantation process and/or configuring a thickness of the substrate material portion 3302 according to a predetermined height of fin members to be subsequently formed. The thickness of the substrate material portion 3302 may be substantially equal to and/or related to the height of the fin members.

Figure 5:
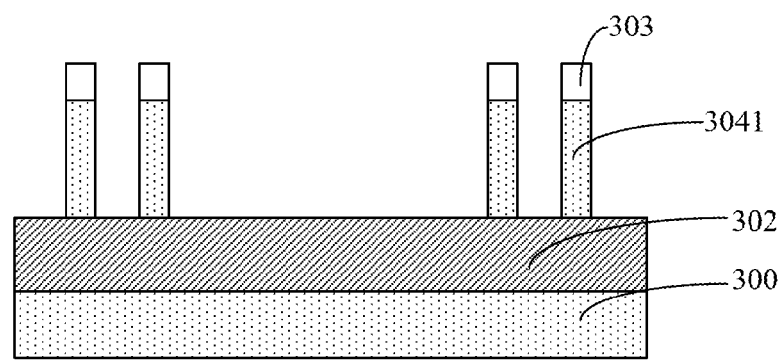

Referring to FIG. 4 and FIG. 5, the method may include the following steps: providing a mask layer 303 on the doped substrate material member 3301; and partially removing the substrate material portion 3302 (e.g., by etching the doped substrate material member 3301 down to the top side of the doped region 302) through the mask layer 303 to form fin members 3041. The method may include configuring a pattern of the mask layer 303 according to one or more predetermined positions, one or more predetermined shapes, one or more predetermined dimensions, one or more predetermined widths, and/or one or more predetermined lengths of the fin members 3041.

The mask layer 303 may be or include a hard mask material layer and/or a photoresist masking material layer. The mask layer 303 may include a photoresist mask material layer. The mask layer 303 may include at least one of a positive photoresist material layer, a negative photoresist material layer, and a hybrid photoresist material layer. The mask layer 303 may be removed immediately or soon after the fin members 3041 have been formed. The mask layer 303 may be removed before subsequent formation of isolation members. The mask layer 303 may be removed through an oxidation process and/or an ashing process. The mask layer 303 may be removed during or after formation of isolation members.

The substrate material portion 3302 may be partially removed through a dry etching process and/or a wet etching process. The dry etching process may include at least one of a reactive ion etching process, an ion beam etching process, a plasma etching process, and a laser ablation process.

Figure 6:
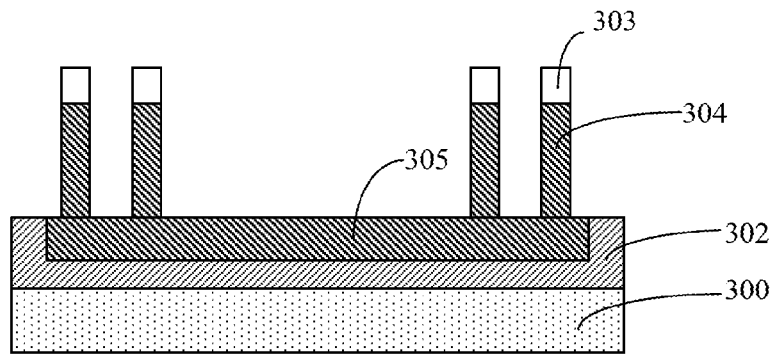

Referring to FIG. 5 and FIG. 6, the method may include performing an ion implantation process on the doped region 302 (and the fin member 3041) to form doped region 305 (and doped fin members 304). The doped region 305 may be formed in the doped region 302 and/or may be surrounded by the doped region 302. Two opposite sides of the doped region 305 may directly contact the two portions of the doped region 302. At least three sides of the doped region 305 may directly contact the doped region 302. A top side of the doped region 305 may overlap and/or may directly contact bottom sides of two or more fin members 304.

The doped region 305 (and the fin members 304) may be predetermined to have a second dopant type, which is different from and/or opposite to the first dopant type. Second-type dopant elements may be used in the ion implantation process. In an embodiment, the first dopant type may be p-type, the second dopant type may be n-type, and arsenic (As) ions may be implanted into the doped region 302 (and the fin members 3041) to form the doped region 305 (and the fin members 304). In an embodiment, the first dopant type may be n-type, the second dopant type may be p-type, and boron (B) ions may be implanted into the doped region 302 (and the fin members 3041) to form the doped region 305 (and the fin members 304).

The ion implantation process may be a heavy ion implantation process. The doped region 305 may be a highly doped region (or heavily doped region). The carrier concentration of the doped region 305 may be higher than the carrier concentration of the doped region 302. The concentration of the doped region 305 may be higher than the carrier concentration of each of the fin members 3041.

Figure 7:
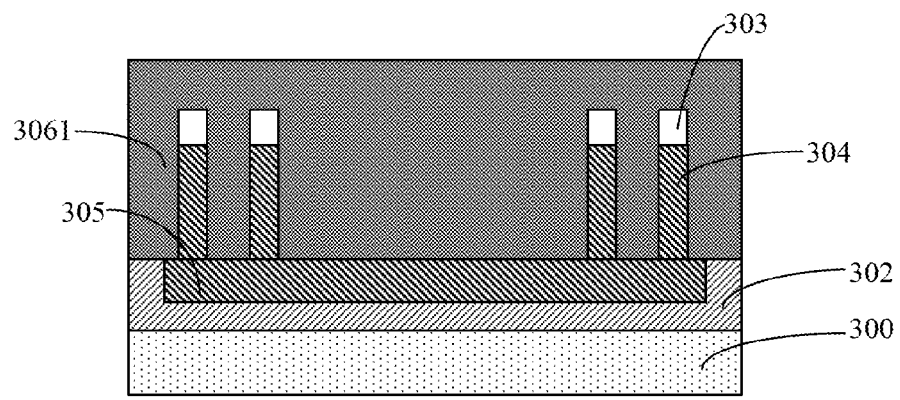

Referring to FIG. 6 and FIG. 7, the method may include providing a dielectric material member 3061 (or insulating material member 3061) on the fin members 304 and on exposed portions of the doped regions 302 and 305. The dielectric material member 3061 may be or include a silicon oxide member and/or a silicon oxynitride member. The dielectric material member 3061 may be formed using at least one of a flowable chemical vapor deposition (FCVD) process, a chemical vapor deposition (CVD) process, a physical vapor deposition (PVD) process, a magnetron sputtering process, etc. The method may include performing a planarization process, such as a mechanical planarization process and/or a chemical-mechanical planarization (CMP) process, on the dielectric material member 3061.

Figure 8:
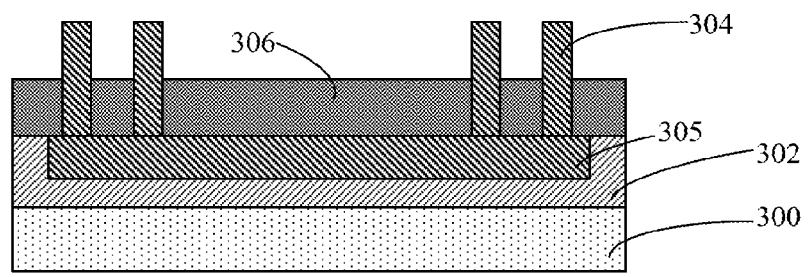

Referring to FIG. 7 and FIG. 8, the method may include partially removing (e.g., etching back) the dielectric material member 3061 to form isolation members 306. Top sides of the isolation members 306 may be higher than bottom sides of the fin members 304 and may be lower than top sides of the fin members 304. An isolation member 306 may be positioned between two fin members 304, may directly contact the two fin members 304, and may directly contact a top side of the doped region 305. The top side of the doped region 305 may be substantially parallel to the top side of the isolation member 306, the interface between the doped regions 305 and 302, the interface between the doped region 302 and the substrate portion 300, a bottom side of the substrate portion 300, and/or a bottom side of the manufactured semiconductor device 3000. The dope region 305 may be positioned between the isolation member 306 and the doped region 302 (in a direction perpendicular to the top side of the isolation member 306).

The dielectric material member 3061 may be partially removed through an etching process, such as a dry etching process, a wet etching process, and/or a reactive ion etching (RIE) process. In the etching process, the etch rate associated with the dielectric material member 3061 may be substantially higher than the etch rate associated with the fin members 304. In the RIE process, sulfur hexafluoride ($SF_6$), nitrogen (N), and/or chlorine (Cl) may be used as one or more etchants.

The method may include using the mask layer 303 to protect the fin members 304 when etching the dielectric material member 3061 to form the isolation members 306. In the etching process, the mask layer 303 may be removed.

Figure 9:
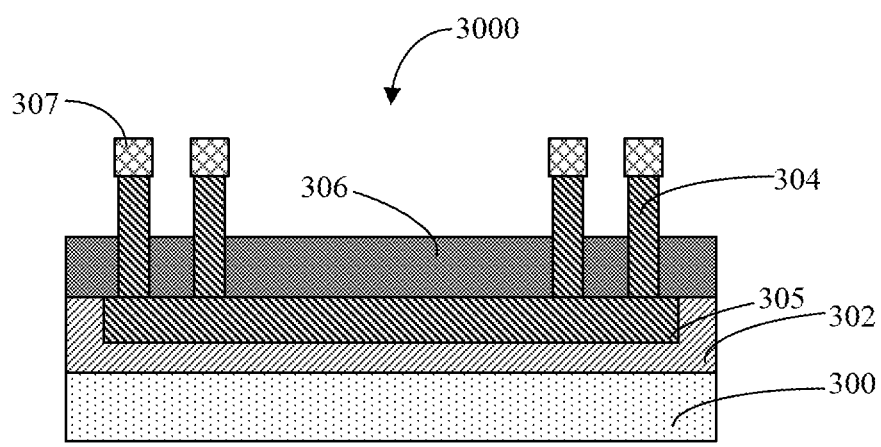

Referring to FIG. 8 and FIG. 9, the method may include forming doped portions 307 on the fin members 304. The method may include performing an epitaxial growth process on the fin members 304 and/or performing an in-situ doping process to form the doped portions 307. A doped portion 307 may be a silicon-germanium (SiGe) member and may function as a source terminal or a drain terminal of a p-channel unit of the semiconductor device 3000. A doped portion 307 may be a silicon carbide (SiC) member and may function as a source terminal or a drain terminal of an n-channel unit of the semiconductor device 3000.

The method may include performing an annealing process for optimizing contacts between the doped portions 307 and the fin members 304.

According to embodiments, the doped region 302 and the doped region 305 may form a p-n junction diode that has a sufficiently large area. The diode may enable effective (and robust) protection of the semiconductor device 3000 against potential electrostatic discharge (ESD) events. Advantageously, satisfactory performance and/or reliability of the semiconductor device 3000 (and an associated electronic device) may be attained.

An embodiment may be related to an electronic device. The electronic device may include an electronic component and the semiconductor device 2000 or 3000. The semiconductor device 2000 or 3000 may be electrically connected to the electronic component 1301. The semiconductor device 2000 or 3000 may have the above-discussed features.

In an embodiment, the electronic device may be or may include one or more of a mobile phone, a tablet computer, a notebook computer, a netbook, a game console, a television, a video compact disc (VCD) player, a digital video disc (DVD) player, a navigation device, a camera, a camcorder, a voice recorder, an MP3 player, an MP4 player, a portable game device, etc.

In an embodiment, the electronic device may be or may include an intermediate product (e.g., a mobile phone main board) or module including a semiconductor device that may have one or more of the features and advantages discussed above.

According to embodiments, a semiconductor device with one or more fin structures may have a p-n junction diode that has a sufficiently large area. The diode may enable effective (and robust) protection of the semiconductor device against potential electrostatic discharge (ESD) events. Advantageously, satisfactory performance and/or reliability of the semiconductor device (and an associated electronic device) may be attained.

While some embodiments have been described as examples, there are alterations, permutations, and equivalents. It should also be noted that there are many alternative ways of implementing the methods and apparatuses. Furthermore, embodiments may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents.

What is claimed is:

1. A semiconductor device comprising:
   a first doped region, which has a first dopant type;
   a second doped region, which has a second dopant type and is positioned between two portions of the first doped region;
   two fin members, which overlap at least one of the first doped region and the second doped region; and
   an isolation member, which is formed of a dielectric material and is positioned between the two fin members, wherein the second doped region is positioned between the isolation member and the first doped region.

2. The semiconductor device of claim 1, wherein the first dopant type is p-type if the second dopant type is n-type, and wherein the first dopant type is n-type if the second dopant type is p-type.

3. The semiconductor device of claim 1, wherein a carrier concentration of the second doped region is higher than a carrier concentration of the first doped region.

4. The semiconductor device of claim 1, wherein the two fin members have the second dopant type, and wherein a carrier concentration of the second doped region is higher than a carrier concentration of the two fin members.

5. The semiconductor device of claim 1, wherein at least two opposite sides of the second doped region directly contact the first doped region.

6. The semiconductor device of claim 1, wherein at least three sides of the second doped region directly contact the first doped region.

7. The semiconductor device of claim 1, wherein a side of second doped region directly contacts the isolation member and is parallel to a bottom side of the semiconductor device.

8. The semiconductor device of claim 1, wherein the second doped region overlaps both the two fin members.

9. The semiconductor device of claim 1, wherein the second doped region directly contacts both the two fin members.

10. The semiconductor device of claim 1, wherein the isolation member directly contacts both the fin members.

11. A semiconductor device comprising:
    a first doped region, which has a first dopant type;
    a second doped region, which has a second dopant type and is positioned between two portions of the first doped region;
    two fin members, which overlap at least one of the first doped region and the second doped region; and
    an isolation member, which is formed of a dielectric material, is positioned between the two fin members, and directly contacts both the two fin members.

* * * * *